United States Patent
Yang et al.

(10) Patent No.: US 12,078,660 B2
(45) Date of Patent: Sep. 3, 2024

(54) SPLIT INSULATED INPUT POST FOR ELECTRICAL MEASUREMENT TOOL

(71) Applicant: Fluke Corporation, Everett, WA (US)

(72) Inventors: Yinhong Yang, Shanghai (CN); Hui Wang, Shanghai (CN); Songnan Fan, Shanghai (CN)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 17/970,476

(22) Filed: Oct. 20, 2022

(65) Prior Publication Data

US 2023/0296646 A1     Sep. 21, 2023

Related U.S. Application Data

(63) Continuation of application No. PCT/CN2022/081064, filed on Mar. 16, 2022.

(51) Int. Cl.
     *G01R 15/12*      (2006.01)
     *G01R 1/04*      (2006.01)
     *G08B 7/06*      (2006.01)

(52) U.S. Cl.
     CPC ......... *G01R 15/125* (2013.01); *G01R 1/0416* (2013.01); *G08B 7/06* (2013.01)

(58) Field of Classification Search
     CPC ................................ G01R 15/125; G08B 7/06
     See application file for complete search history.

(56) References Cited

U.S. PATENT DOCUMENTS

| | | | |
|---|---|---|---|
| 3,597,726 A * | 8/1971 | Appleton | ........... H01R 13/5221 439/724 |
| 6,068,400 A | 5/2000 | Nelson et al. | |
| 6,281,673 B1 | 8/2001 | Zoellick et al. | |
| 9,748,673 B1 * | 8/2017 | Kitatani | ................... H01R 4/34 |
| 2004/0130330 A1 | 7/2004 | Arnoux et al. | |
| 2005/0035767 A1 | 2/2005 | Hardy | |
| 2009/0047841 A1 * | 2/2009 | Morey | ...................... G01R 1/04 439/676 |
| 2015/0131353 A1 * | 5/2015 | Nakajima | ............ H05K 7/2039 363/141 |

FOREIGN PATENT DOCUMENTS

JP      05-60798 A      3/1993

OTHER PUBLICATIONS

International Search Report mailed Sep. 5, 2022, for International Application No. PCT/CN2022/081064, 6 pages.

\* cited by examiner

*Primary Examiner* — Farhana A Hoque
*Assistant Examiner* — Joseph O Nyamogo
(74) *Attorney, Agent, or Firm* — Seed IP Law Group LLP

(57) ABSTRACT

A device for performing electrical measurements according to the present disclosure includes a first input post that is electrically conducting, a second input post that is electrically conducting, and a sleeve that is electrically insulating and at least partially surrounds the first input post and the second input post. The sleeve includes a first rib extending in a longitudinal direction of the sleeve and a second rib extending in the longitudinal direction of the sleeve. The first rib and the second rib are constructed to separate the first input post and the second input post.

20 Claims, 13 Drawing Sheets

SPLIT INSULATED INPUT POST FOR ELECTRICAL MEASUREMENT TOOL

TECHNICAL FIELD

The present disclosure generally relates to electrical measurement tools, and more particularly, to an electrical measurement tool that enable circuit breaker devices to be in a nonconductive state or warning devices to issue warnings in response to test leads being connected to input posts inconsistent with a selected mode of operation, in order to reduce risk of damage to the electrical measurement tool.

DESCRIPTION OF THE RELATED ART

Electrical measurement tools such as digital multimeters have been used to measure a variety of different electrical properties, for example, current, voltage, and resistance. A typical digital multimeter includes different input terminals to which electrical test leads can be connected in order to electrically connect the digital multimeter to an electrical circuit having an electrical property to be measured. Specifically, a typical digital multimeter includes four input terminals, including a first input terminal that is coupled internally to an electrical circuit arranged to measure relatively large electrical currents, a second input terminal that is coupled internally to an electrical circuit arranged to measure medium and relatively small electrical currents, a third input terminal that is coupled internally to a common electrical potential, and a fourth input terminal that is coupled internally to electrical circuits arranged to measure electrical voltages and other electrical properties.

In addition, a typical digital multimeter includes a knob that may be rotated by a user to select a number of different modes of operation of the digital multimeter, for example, modes of operation for different types of current and voltage measurements. If the user connects a test lead to an input terminal used for current measurement while the knob is rotated to a position corresponding to an operation mode for voltage measurement, a high current may flow through the digital multimeter. The large current can damage a device being tested and may blow an internal fuse of the digital multimeter. Arcing, damage to the multimeter, and injury to the user can result if a source voltage exceeds a fuse rating of the internal fuse of the digital multimeter.

BRIEF SUMMARY

The present disclosure teaches a device including one or more split input terminals used for current measurement that can reduce the risk of damage to the device. A controller coupled to the split input terminal receives a signal indicating a mode in which the device is operating, and a signal indicating whether input posts of the split input terminal are electrically coupled together, which indicates whether a test lead is inserted into the split input terminal. The controller can cause a circuit breaking device to be in a nonconductive state, to protect internal components of the device, such as a fuse, for example. Additionally or alternatively, the controller can cause a warning device to issue a warning to a user of the device so that the user can take corrective action before damage to the device occurs or injury to the user results.

DETAILED DESCRIPTION

An electrical measurement tool can be damaged if it is used to measure an electrical property with a test lead connected to an input terminal of the electrical measurement tool that is inappropriate based on a selected mode of operation. For example, an internal fuse of a digital multimeter can be damaged if the digital multimeter is operated in a voltage measurement mode and used to measure a voltage with a test lead connected to an input terminal of the digital multimeter that is for current measurement.

According to the present disclosure, damage to an electrical measurement tool can be prevented. The present disclosure teaches a split input terminal that enables an electrical measurement tool to determine whether a test lead is connected to the input terminal while the electrical measurement tool is operating in a selected mode of operation. If the electrical measurement tool determines that the test lead is connected to the input terminal while the electrical measurement tool is operating in the selected mode of operation, the electrical measurement tool causes a circuit breaker device to be in a nonconductive state in order to prevent the flow of current through a component that may be damaged due to improper operation of the electrical measurement tool. Additionally or alternatively, if the electrical measurement tool determines that the test lead is connected to the input terminal while the electrical measurement tool is operating in the selected mode of operation, the electrical measurement tool causes a warning device to issue a warning so that an operator of the electrical measurement tool can take corrective action (e.g., connect the test lead to a different input terminal or change the mode of operation of the electrical measurement tool) before the electrical measurement tool is used in a manner that could damage the electrical measurement tool.

Figure 1:
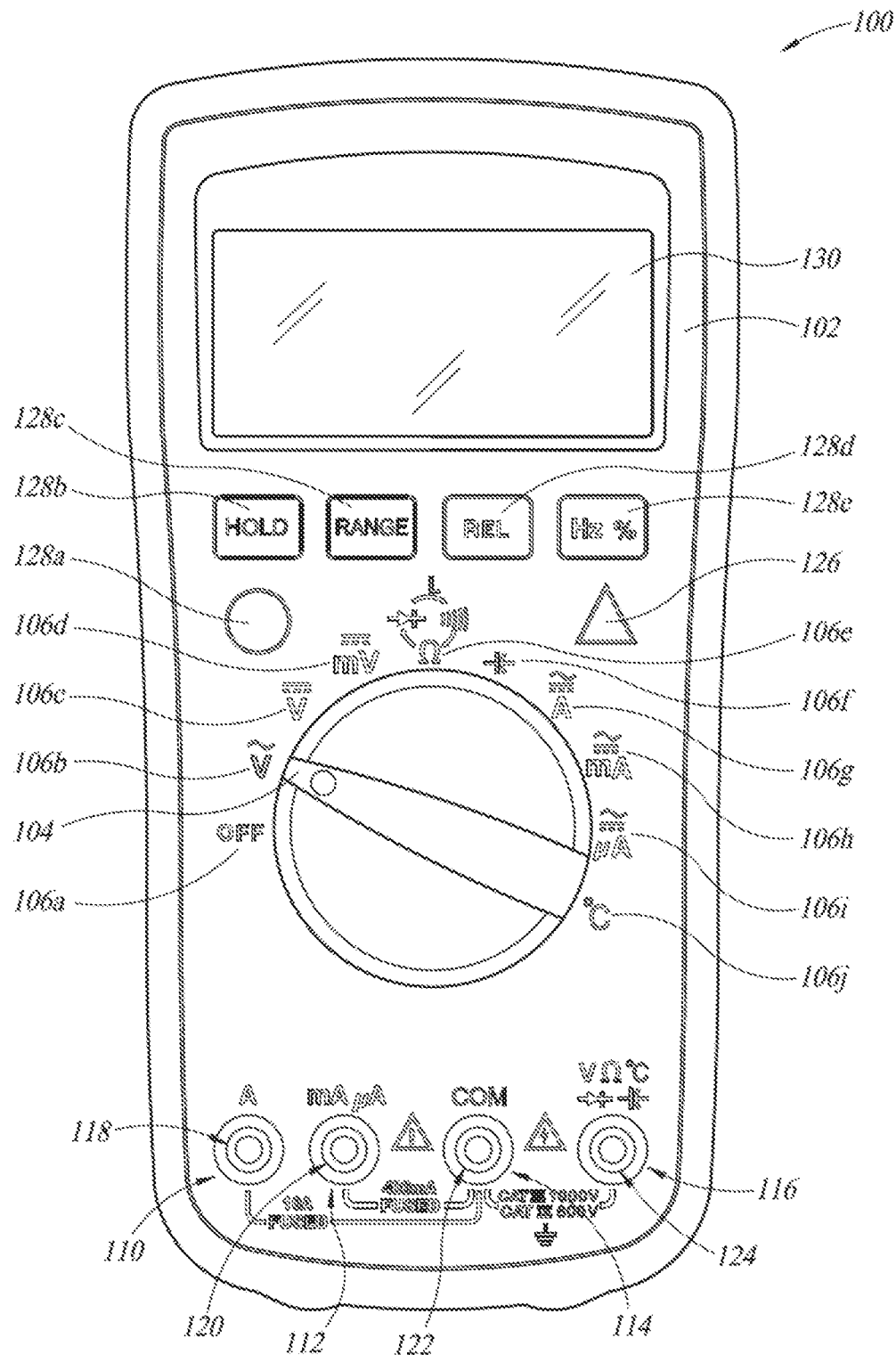
FIG. 1 is a front plan view of an external appearance of a device in accordance with embodiments described herein.

FIG. 1 is a view of an external appearance of a system or device 100 in accordance with embodiments described herein. In one or more implementations, the device 100 is a digital multimeter. For example, the device may be similar in many relevant respects to a Model 17B+ Digital Multimeter available from Fluke Calibration, as modified by the present disclosure.

The device 100 includes a case 102 that encloses various components of the device 100. A rotatable knob 104 is provided on a front portion of the case 102. The rotatable knob 104 may be rotated such that a tip of the knob is positioned at one of a plurality of positions 106a to 106j on the front portion of the case 102.

More particularly, while the rotatable knob 104 is rotated to the position 106a, the device 100 is turned off, and battery power is not provided to various electrical components of the device 100. While the rotatable knob 104 is rotated to the position 106b, the device 100 operates in a mode in which a relatively large alternating current (AC) voltage is measureable by a measurement circuit. While the rotatable knob 104 is rotated to the position 106c, the device 100 operates in a mode in which a relatively large direct current (DC) voltage is measurable by a measurement circuit. While the rotatable knob 104 is rotated to the position 106d, the device 100 operates in a mode in which a relatively small DC voltage is measurable by a measurement circuit. While the rotatable knob 104 is rotated to the position 106e, the device 100 operates in a mode in which a resistance is measurable by a measurement circuit, continuity can be checked by a measurement circuit, or a diode junction is measurable by a measurement circuit. While the rotatable knob 104 is rotated to the position 106f, the device 100 operates in a mode in which a capacitance is measurable by a measurement circuit. While the rotatable knob 104 is rotated to the position 106g, the device 100 operates in a mode in which a relatively large AC or DC current is measurable by a measurement circuit. While the rotatable knob 104 is rotated to the position 106h, the device 100 operates in a mode in which a medium AC or DC current is measurable by a measurement circuit. While the rotatable knob 104 is rotated to the position 106i, the device 100 operates in a mode in which a relatively small AC or DC current is measurable by a measurement circuit. While the rotatable knob 104 is rotated to the position 106j, the device 100 operates in a mode in which a temperature is measurable by a measurement circuit.

The case 102 includes four recessed portions 110 to 116 in which four input terminals 118 to 124 are respectively disposed. The input terminal 118 is a split input terminal that includes an electrically insulating sleeve surrounding two input posts that are spaced apart and electrically isolated from each other, wherein at least one of the input posts of the split input terminal 118 is electrically coupled to a portion of the measurement circuit that is arranged to measure a relatively large AC or DC current. When an electrically conducting connector of an electrical test lead is inserted into the insulating sleeve of the split input terminal 118, the electrically conducting connector electrically couples the input posts of the split input terminal 118 together. The input terminal 120 is also a split input terminal having a configuration similar to that of the input terminal 118, wherein at least one of the input posts of the split input terminal 120 is electrically coupled to a portion of the measurement circuit that is arranged to measure a medium and a relatively small AC or DC current. The input terminal 122 is a conventional input terminal including an electrically insulating sleeve and a single input post that is electrically coupled to a common or reference electrical potential. The input terminal 124 is also a conventional input terminal, including an electrically insulating sleeve and a single input post that is electrically coupled to various portions of the measurement circuit that are arranged to measure different magnitudes of voltages, among other things.

In addition, the device 100 includes an indicator 126 used to issue a warning to a user of the device 100. For example, the indicator 126 contains a red light-emitting diode (LED) that flashes when a user inserts a test least into the split input terminal 118 or the split input terminal 120 while the rotatable knob 104 is rotated to position that sets a mode of operation other than a mode of operation for current measurement. The device 100 also includes buttons 128a to 128e that are used by a user to provide input for controlling the operation of the device 100. Additionally, the device 100 includes a display device 130 that displays results of electrical measurements, operating status information, and warnings. In one or more implementations, the display device 130 includes a liquid crystal device (LCD) display screen.

Figure 2A:
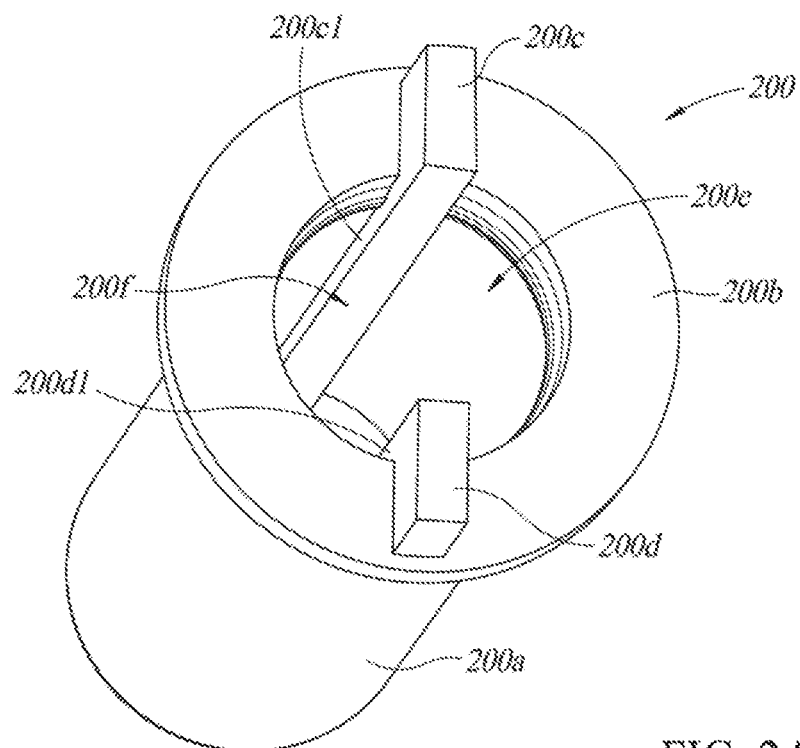
FIGS. 2A and 2B are perspective views of an electrically insulating sleeve of a split input terminal included in the device shown in FIG. 1.
Figure 2B:
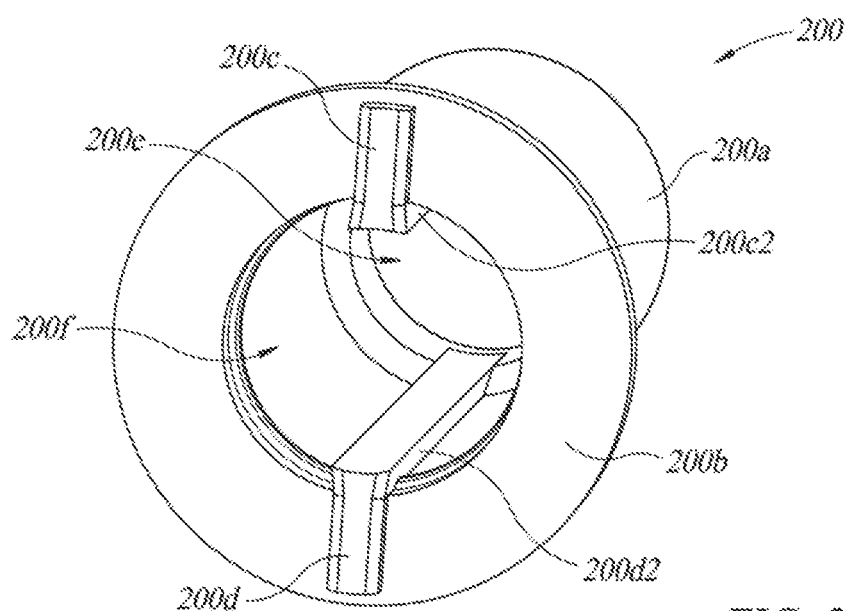

FIGS. 2A and 2B are perspective views of an electrically insulating sleeve 200 included in a split input terminal in accordance with embodiments described herein. For example, an electrically insulating sleeve 200 is included in each of the split input terminals 118 and 120 of the device 100 shown in FIG. 1. The electrically insulating sleeve 200 includes a generally cylindrical body portion 200a and a flange portion 200b that extends radially from the body portion 200a. A rib 200c extends in a longitudinal direction of the electrically insulating sleeve 200 inside of the body portion 200a and also projects outwardly from the flange portion 200b. Similarly, a rib 200d extends in the longitudinal direction of the electrically insulating sleeve 200 inside of the body portion 200a and also projects outwardly from the flange portion 200b. The ribs 200c and 200d divide a compartment inside of the body portion 200a into different portions 200e and 200f that are spaced apart from each other by the ribs 200c and 200d. Thus, when input posts are disposed in the portions 200e and 200f, the input posts are spaced apart from each other. Accordingly, the input posts are not electrically coupled together, unless a test lead is inserted into the insulating sleeve 200, which enables a controller of the device 100 to determine when a test lead is inserted into a split input terminal including the input posts, as explained in detail below.

As shown in FIGS. 2A and 2B, the rib 200c includes two side surfaces 200c1 and 200c2, and the rib 200d includes the two side surfaces 200d1 and 200d2. In one or more embodiments, the side surfaces 200c1 and 200c2 of the rib 200c are substantially perpendicular to an inner surface of the cylindrical body portion 200a, and the side surfaces 200d1 and 200d2 of the rib 200d are substantially perpendicular to the inner surface of the cylindrical body portion 200a. In one or more embodiments, the side surfaces 200c1 and 200c2 of the rib 200c form an angle of less than ninety degrees with the inner surface of the cylindrical body portion 200a, and the side surfaces 200d1 and 200d2 of the rib 200d form an angle of less than ninety degrees with the inner surface of the cylindrical body portion 200a. The side surfaces 200c1 and 200c2 of the rib 200c, and the side surfaces 200d1 and 200d2 of the rib 200d hold input posts of a split input terminal in the insulating sleeve 200 during assembly of the device 100.

Figure 2C:
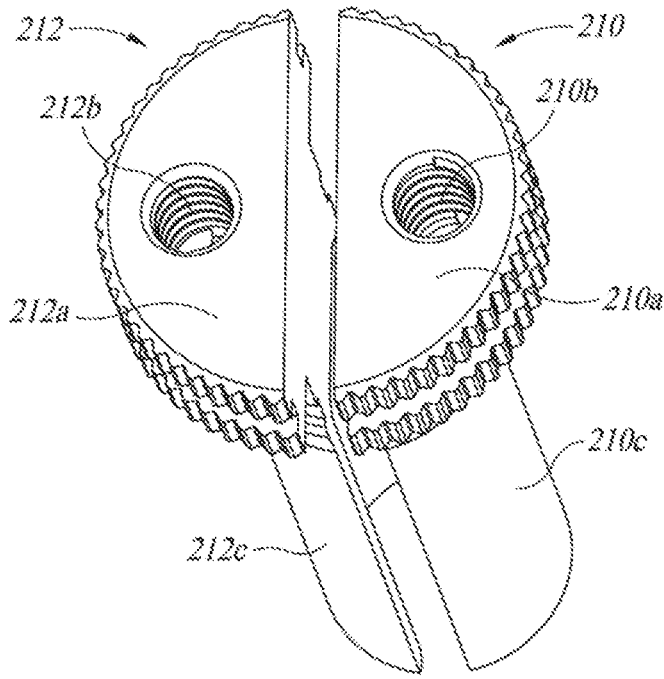
FIG. 2C is a perspective view of a pair of input posts of a split input terminal included in the device shown in FIG. 1.

FIG. 2C is a perspective view of a pair of input posts 210 and 212 of a split input terminal in accordance with embodiments described herein. For example, a pair of input posts 210 and 212 is included in each of the split input terminals 118 and 120 of the device 100 shown in FIG. 1. The input post 210 includes a base portion 210a having an aperture 210b formed therein adjacent to a threaded portion formed in the base portion 210a, and a curved terminal portion 210c extending from the base portion 210a. Similarly, the input post 212 includes a base portion 212a having an aperture 212b formed therein adjacent to a threaded portion formed in the base portion 212a, and a curved terminal portion 212c extending from the base portion 212a.

Figure 2D:
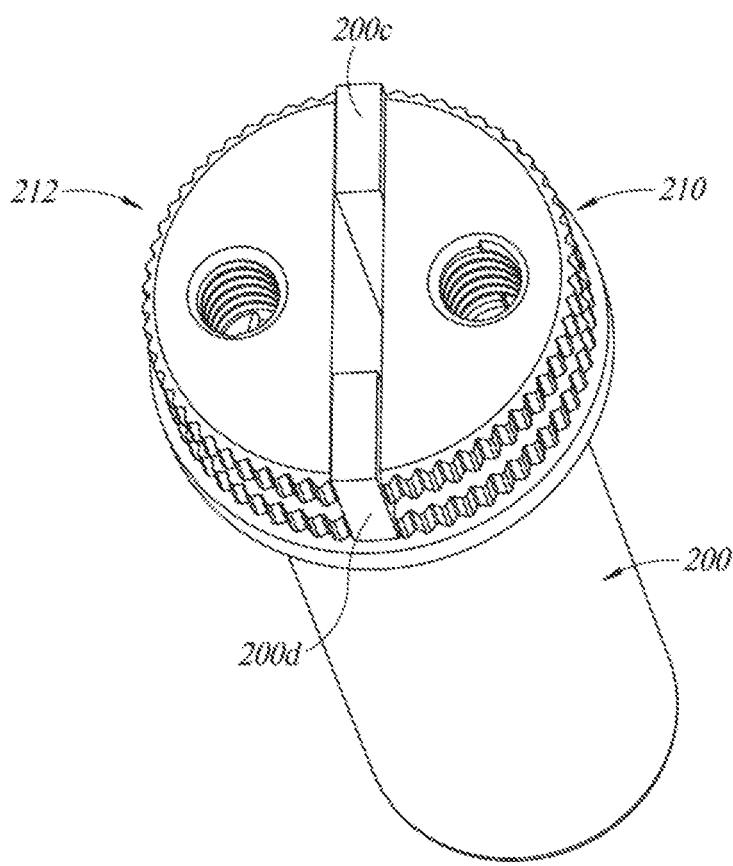
FIG. 2D is a perspective view of a partially assembled split input terminal in which the pair of input posts shown in FIG. 2C has been inserted into the electrically insulating sleeve shown in FIGS. 2A and 2B.

FIG. 2D is a perspective view of a partially assembled split input terminal in which the pair of input posts 210 and 212 shown in FIG. 2C has been inserted into the electrically insulating sleeve 200 shown in FIGS. 2A and 2B. More particularly, the input post 210 has been inserted into the portion 200e of the compartment inside of the body portion 200a, and the input post 212 has been inserted into the portion 200f of the compartment inside of the body portion 200a. As can be seen in FIG. 2D, the ribs 200c and 200d of the electrically insulating sleeve 200 keep the input posts 210 and 212 spaced apart and electrically isolated from each other. After the input post 210 and the input post 212 have been inserted into the insulating sleeve 200, the input post 210 contacts the side surface 200c2 of the rib 200c and the side surface 200d2 of the rib 200d, and the input post 212 contacts the side surface 200c1 of the rib 200c and the side surface 200d1 of the rib 200d.

Figure 2E:
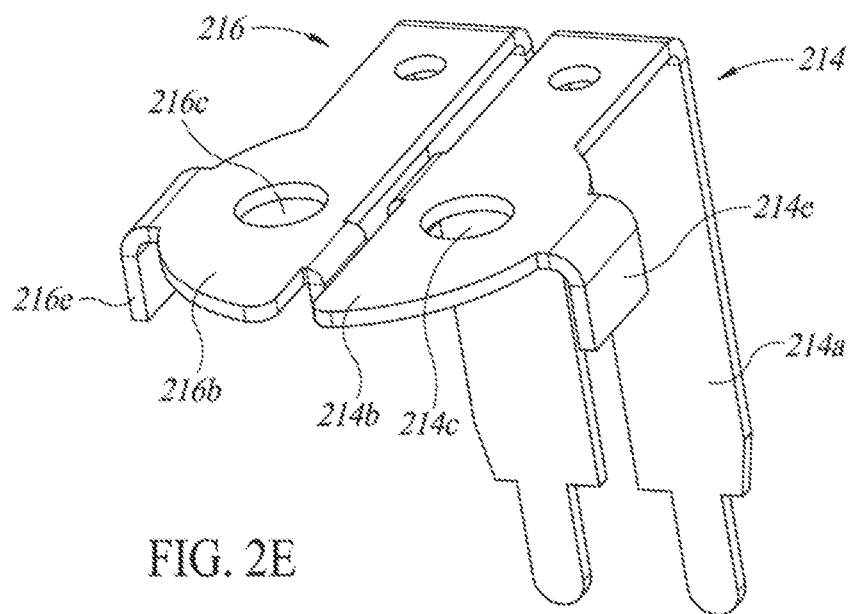
FIGS. 2E and 2F are perspective views of a pair of electrical connectors of a split input terminal included in the device shown in FIG. 1.
Figure 2F:
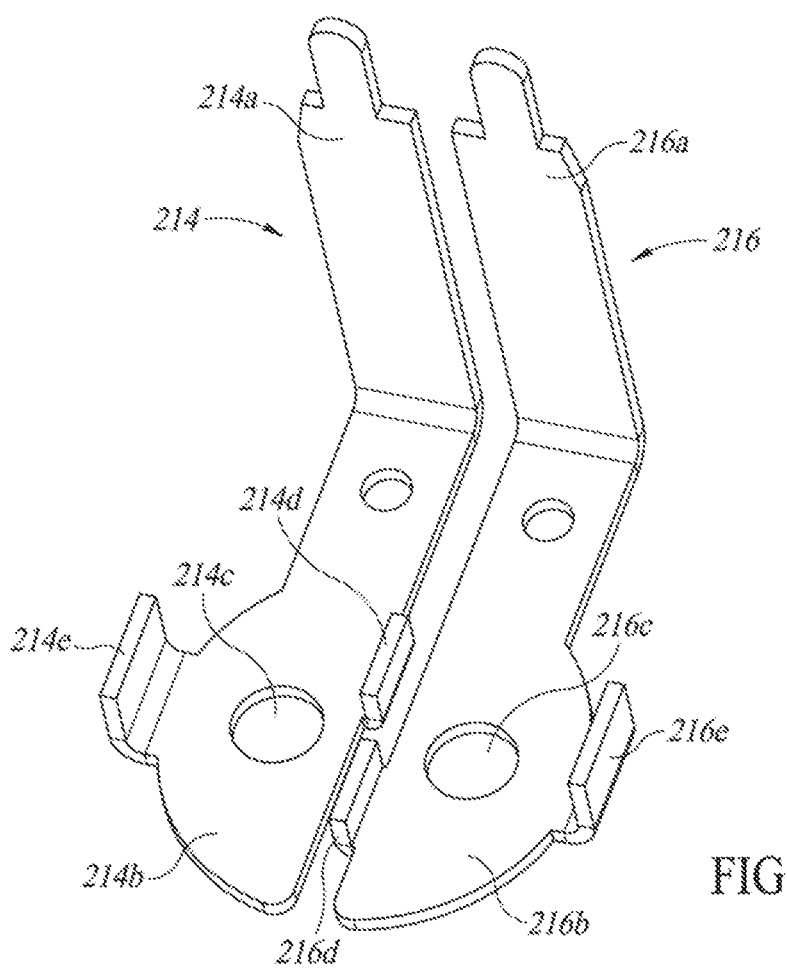

FIGS. 2E and 2F are perspective views of a pair of electrical connectors 214 and 216 of a split input terminal in accordance with embodiments described herein. For example, each of the split input terminals 118 and 120 of the device 100 shown in FIG. 1 includes a pair of electrical connectors 214 and 216. The electrical connector 214 includes a connection portion 214a for electrically connecting the split input terminal to a component of the device 100, a contact portion 214b for electrically connecting the electrical connector 214 to an input post of the split input terminal, an aperture 214c formed in the contact portion 214b, a retaining portion 214d that extends from the contact portion 214b, and a retaining portion 214e that extends from the contact portion 214b. In one or more implementations, the contact portion 214b is flat and the retaining portions 214d and 214e are perpendicular to the contact portion 214b. Similarly, the electrical connector 216 includes a connection portion 216a for electrically connecting the split input terminal to a component of the device 100, a contact portion 216b for electrically connecting the electrical connector 216 to an input post of the split input terminal, an aperture 216c formed in the contact portion 216b, a retaining portion 216d that extends from the contact portion 216b, and a retaining portion 216e that extends from the contact portion 216b. In one or more implementations, the contact portion 216b is flat, and the retaining portions 216d and 216e are perpendicular to the contact portion 216b.

Figure 2G:
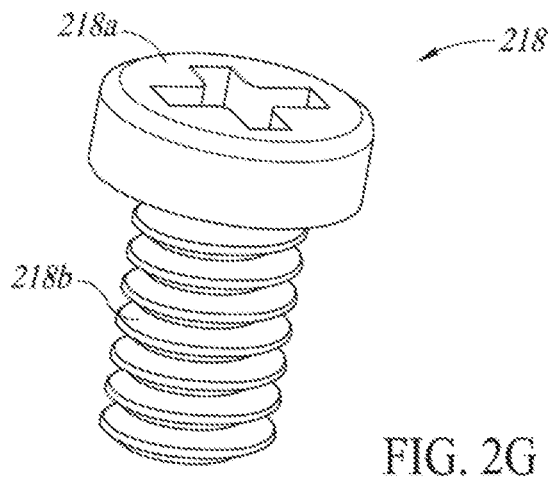
FIG. 2G is a perspective view of a type of screw used to attach the pair of electrical connectors shown in FIGS. 2E and 2F to the pair of input posts included in the partially assembled split input terminal shown in FIG. 2D in accordance with embodiments described herein.

FIG. 2G is a perspective view of a type of screw 218 used to attach the pair of electrical connectors 214 and 216 to the pair of input posts 210 and 212 included in the partially assembled split input terminal shown in FIG. 2D in accordance with embodiments described herein. The screw 218 includes a base portion 218a and a threaded portion 218b that extends from the base portion 218a. The threaded portion 218b has a diameter that is smaller than the diameter of the apertures 210b and 212b of the pair of input posts 210 and 212, and smaller than a diameter of the apertures 214c and 216c of the pair of electrical connectors 214 and 216. The threaded portion 218b includes threads that mate with treads included in the threaded portions of the input posts 210 and 212.

Figure 3A:
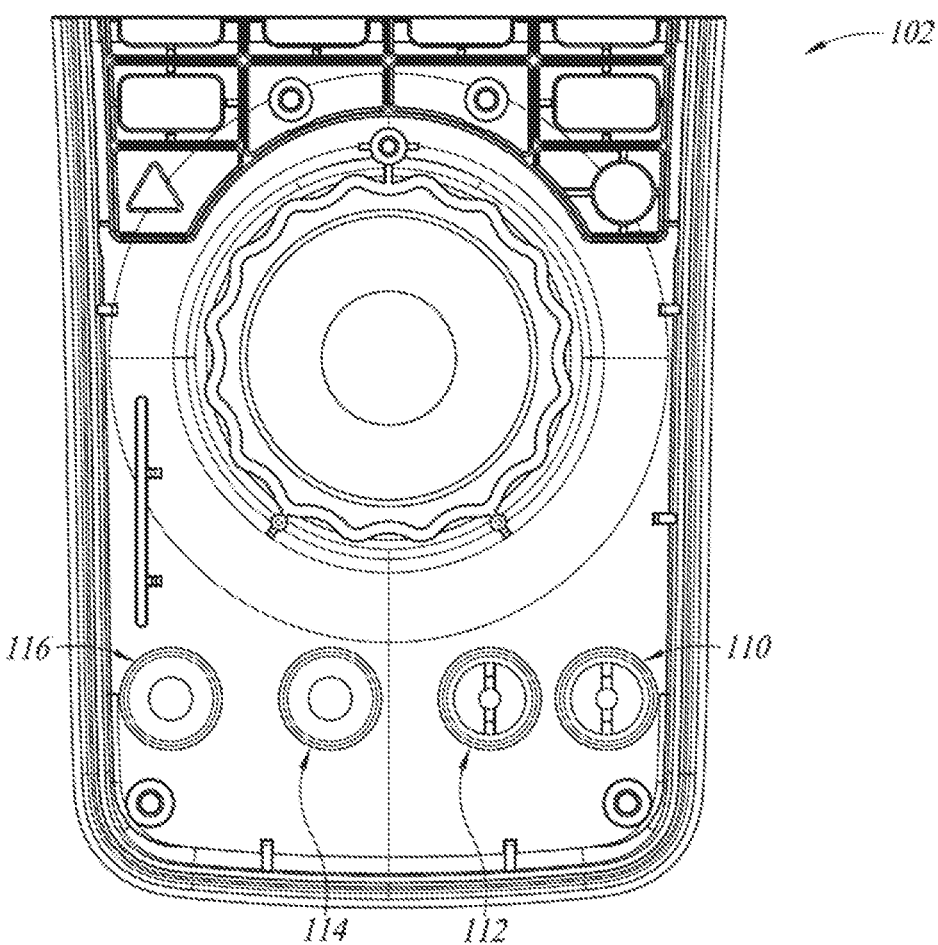
FIG. 3A is a sectional view of a portion of a case of the device shown in FIG. 1.
Figure 3B:
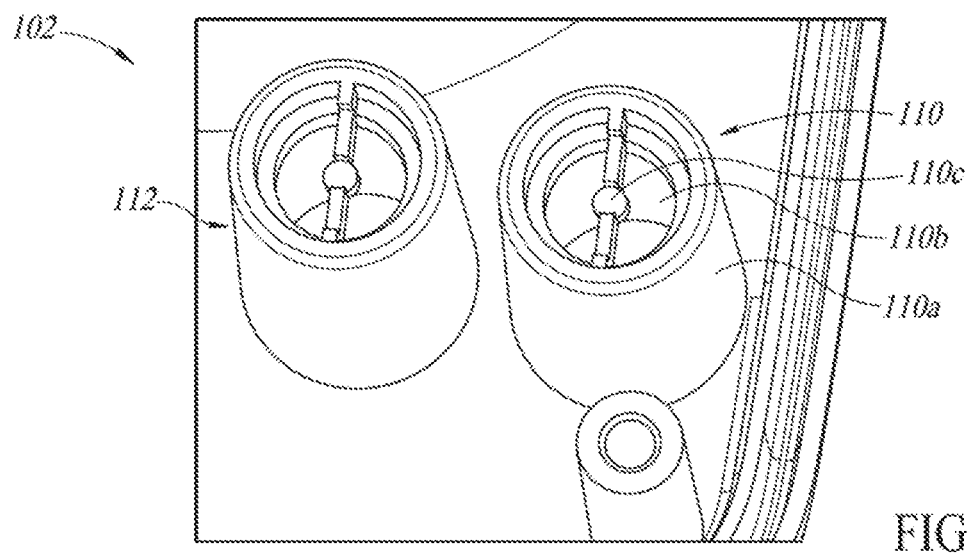
FIG. 3B is an enlarged perspective view of part of the portion of the case shown in FIG. 3A.

FIG. 3A is a sectional view of a portion of the case 102 of the device 100 shown in FIG. 1. FIG. 3B is an enlarged perspective view of part of the portion of the case 102 shown in FIG. 3A. As shown in FIG. 3B, the recessed portion 110 of the case 102 includes a generally cylindrical side wall 110a. An end of the recessed portion 110 of the case 102 includes an aperture 110b and a separating portion 110c that extends across the aperture case and divides the aperture 110b into two portions. The structure of the recessed portion 112 is similar to that of the recessed portion 110.

Figure 3C:
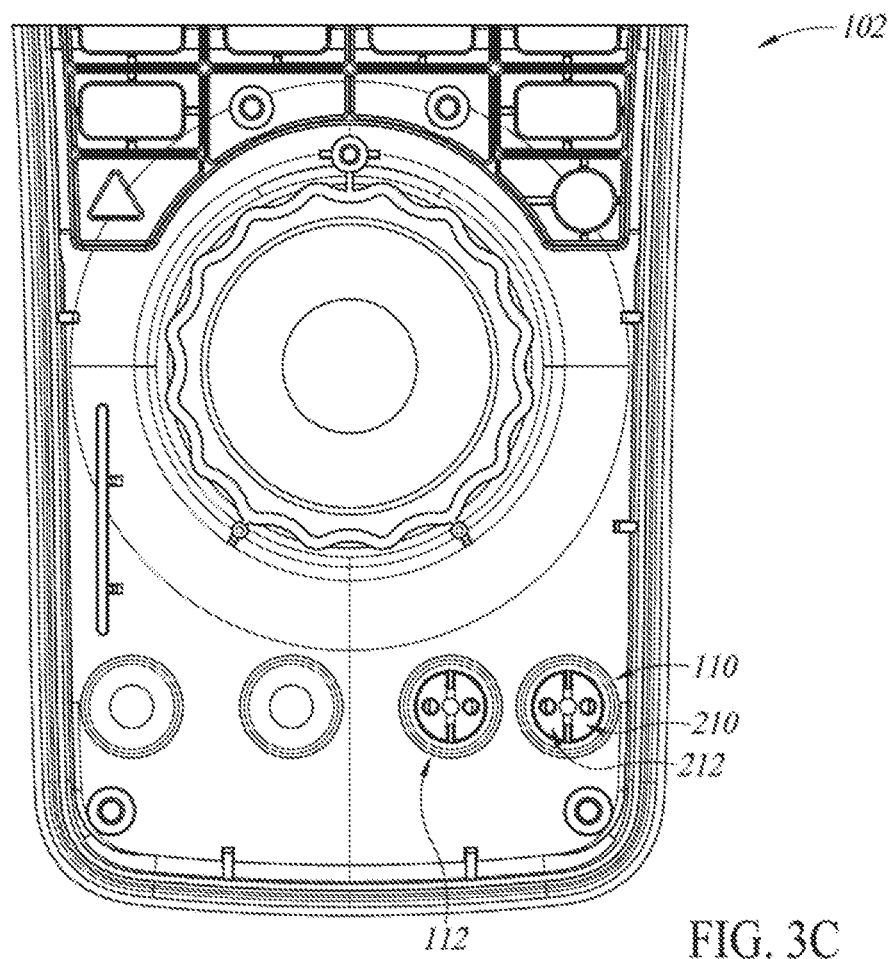
FIG. 3C is a sectional view of the portion of the case of the device shown in FIG. 3A with two partially assembled split input terminals inserted in the case.
Figure 3D:
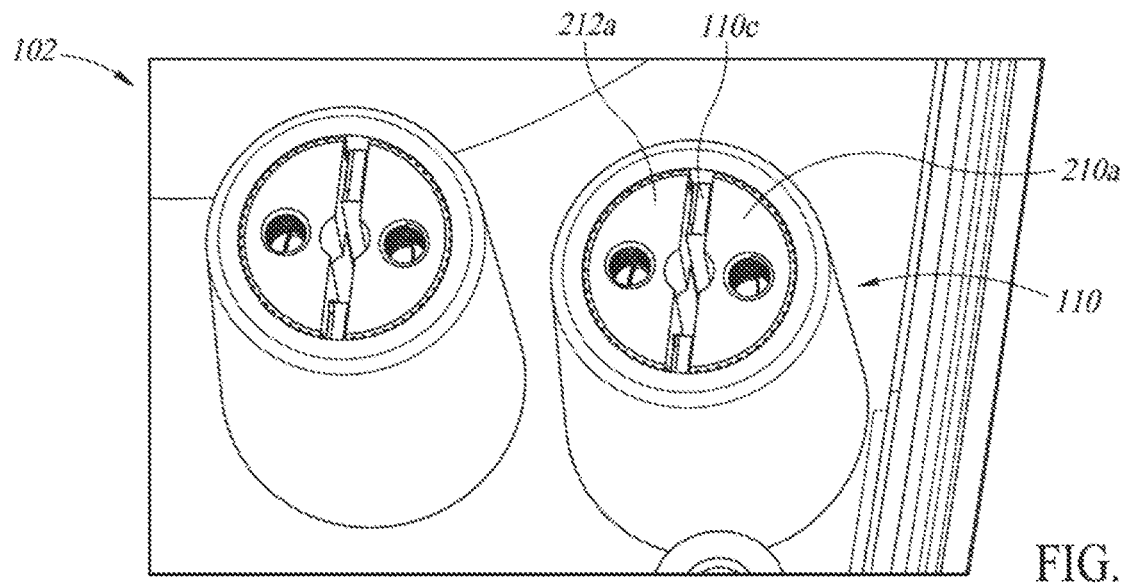
FIG. 3D is an enlarged perspective view of part of the portion of the case shown in FIG. 3C.

FIG. 3C is a sectional view of the portion of the case 102 of the device 100 shown in FIG. 3A with two partially assembled split input terminals inserted in the case 102. FIG. 3D is an enlarged perspective view of the part of the portion of the case 102 shown in FIG. 3C. More particularly, FIGS. 3C and 3D show the portion of the case 102 of the device 100 shown in FIG. 3A after two partially assembled split input terminals (each similar to the partially assembled split terminal shown in FIG. 2D) are inserted into the recessed portions 110 and 112 from the front side of the case 102. As shown in FIGS. 3C and 3D, when the input terminals 210 and 212 are inserted into the recessed portion 110, the separating portion 110c is disposed between the base portion 210a of the input post 210 and the base portion 212a of the input post 212.

Figure 3E:
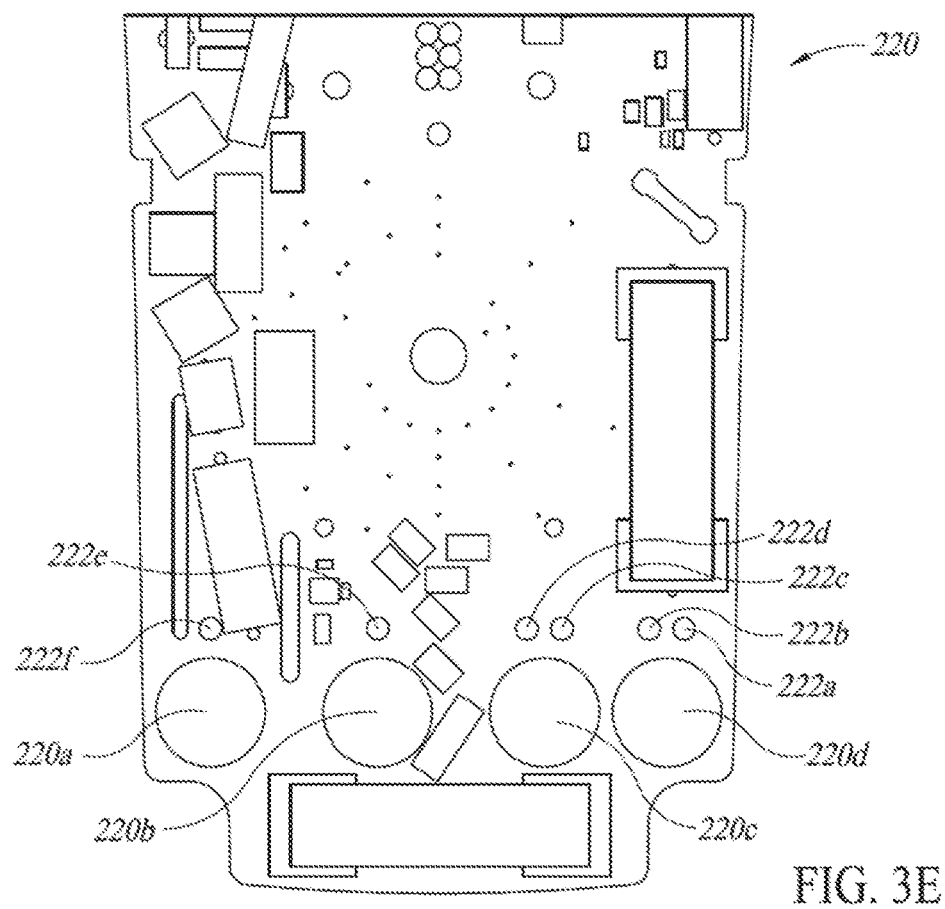
FIG. 3E is a front plan view of a portion of a printed circuit board.

FIG. 3E is a front plan view of a portion of a printed circuit board 220 in accordance with embodiments described herein. The printed circuit board 220 has apertures 220a to 220d formed therein, which respectively correspond to the recessed portions of the case 102. More particularly, the aperture 220a corresponds to the recessed portion 116 of the case 102, the aperture 220b corresponds to the recessed portion 114 of the case 102, the aperture 220c corresponds to the recessed portion 112 of the case 102, and the aperture 220d corresponds to the recessed portion 110 of the case 102. The printed circuit board 220 has electrical conductors 222a to 222f formed thereon, each of which is coupled to a conductive trace that is coupled to an electrical component of the device 100.

Figure 3F:
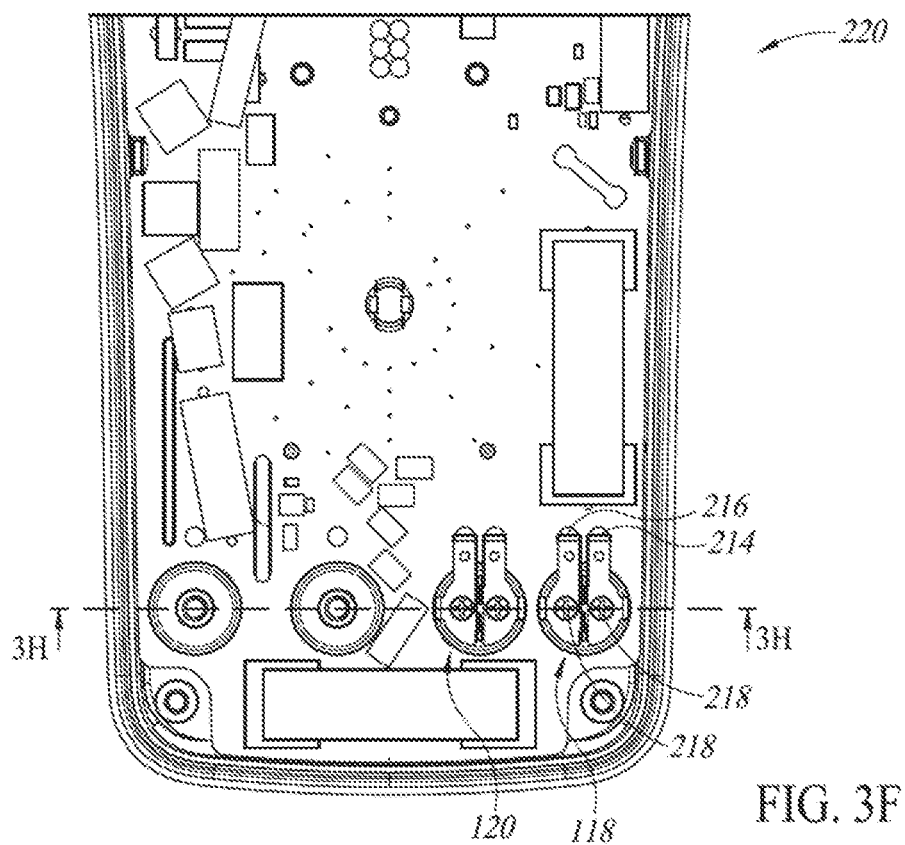
FIG. 3F is a sectional view of the portion of a partially assembled device including the portion of the case shown in FIG. 3C with the portion of the printed circuit board shown in FIG. 3E placed thereon and with two split input terminals coupled to the printed circuit board.

FIG. 3F is a sectional view of the portion of a partially assembled device 100, including the portion of the case 102 shown in FIG. 3C with the portion of the printed circuit board 220 shown in FIG. 3E placed thereon and with the two split input terminals 118 and 120 coupled to the printed circuit board 220. More particularly, each of the electrical connectors of the split input terminals 118 and 120 is soldered to an electrical conductor formed on the printed circuit board 220. For example, the electrical connector 214 of the split input terminal 118 is soldered to the electrical conductor 222a, and the electrical connector 216 of the split input terminal 118 is soldered to the electrical conductor 222b. As shown in FIG. 3F, the recessed portions 118 to 124 of the case 102 are disposed in one of the apertures 220a to 220d formed in the printed circuit board 220.

Figure 3G:
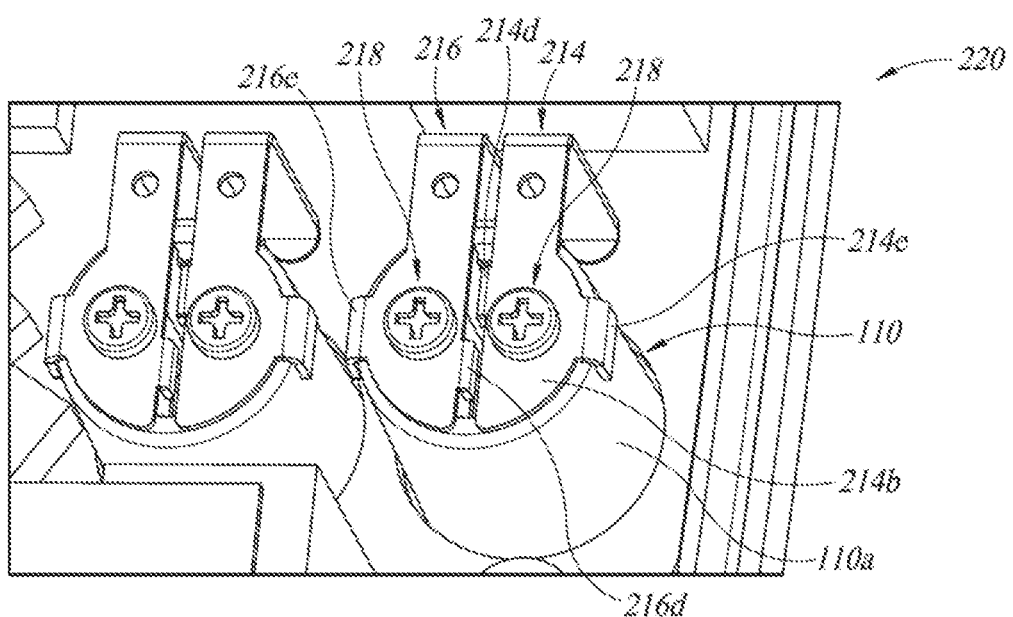
FIG. 3G is an enlarged perspective view of part of the portion of the device shown in FIG. 3F.

FIG. 3G is an enlarged perspective view of part of the portion of the device 100 shown in FIG. 3F. The electrical connector 214 is coupled to the input post 210 using a screw 218, and the electrical connector 216 is coupled to the input post 212 using a screw 218. As shown in FIG. 3G, the retaining portion 214d of the electrical connector 214 is disposed on a side surface of the electrical connector 214 that is between the electrical connector 214 and the electrical connector 216. Similarly, the retaining portion 216d of the electrical connector 216 is disposed on a side surface of the electrical connector 216 that is between the electrical connector 214 and the electrical connector 216. The retaining portion 214d of the electrical connector 214 and the retaining portion 216d of the electrical connector 216 are offset from one another over the separating portion 110c so that they do not contact each other. In addition, the retaining portion 214e of the electrical connector 214 and the retaining portion 216e of the electrical connector 216 are disposed on the sidewall 110a of the recessed portion 110 of the case 102. The retaining portions 214d and 214e of the electrical connector 214 prevent the electrical connector 214 from rotating while a screw 218 is rotated (e.g., with a screwdriver) in order to attach the electrical connector 214 to the input post 210. Similarly, the retaining portions 216d and 216e of the electrical connector 216 prevent the electrical connector 216 from rotating while a screw 218 is rotated in order to attach the electrical connector 216 to the input post 212.

Figure 3H:
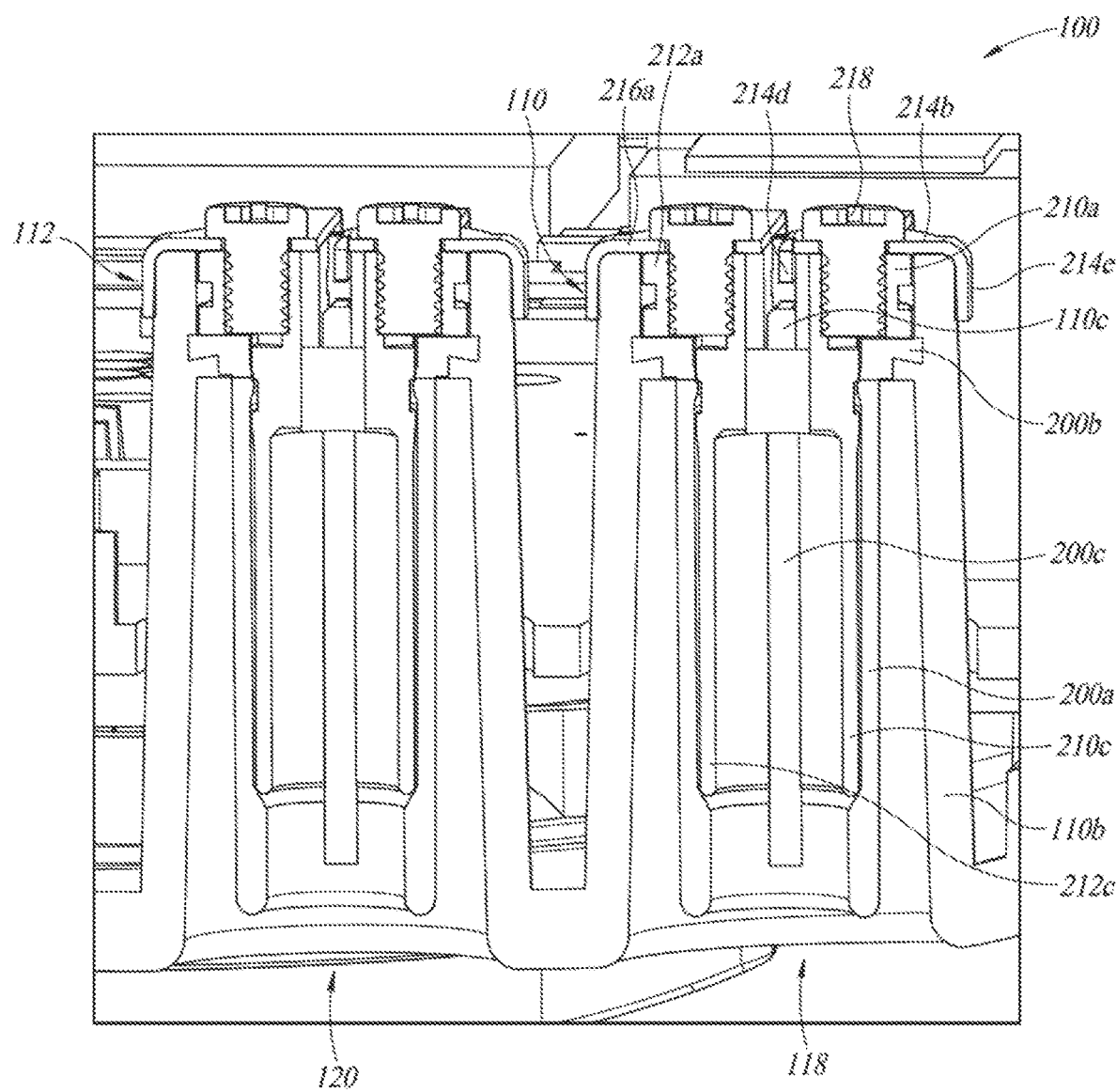
FIG. 3H is a sectional view of the portion of the device shown in FIG. 3F taken along the line 3H in accordance with embodiments described herein.

FIG. 3H is a sectional view of the portion of the device 100 taken along the line 3H in FIG. 3F in accordance with embodiments described herein. As shown in FIG. 3H, the input posts of each of the split input terminals 118 and 120 are held spaced apart from each other by the ribs (e.g., rib 200c) of the electrically insulating sleeve 200 and by the separating portions (e.g., separating portion 110c) of the recessed portions 110 and 112 of the case 102.

Figure 4:
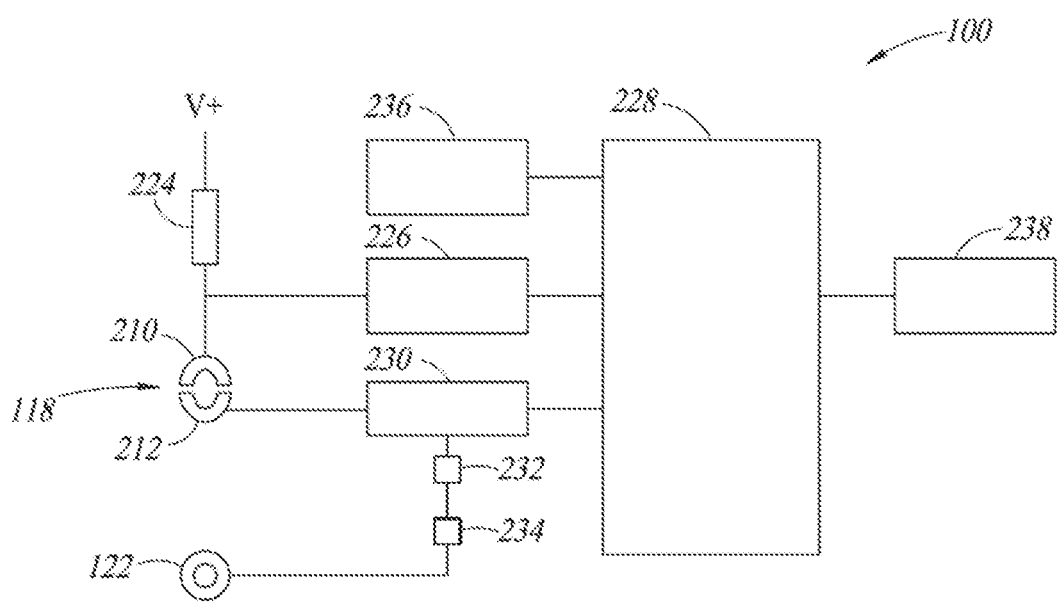
FIG. 4 is a simplified block diagram of a device in accordance with embodiments described herein.

FIG. 4 is a simplified block diagram of a device 100 in accordance with embodiments described herein. FIG. 4 shows the split input terminal 118 and the conventional, common input terminal 122. For illustrative simplicity, FIG. 4 does not show the split input terminal 120; however, the split input terminal 120 is connected in a manner that is similar to the manner in which the split input terminal 118 is connected, as described below.

As shown in FIG. 4, the input post 210 of the split input terminal 118 is electrically coupled (e.g., with a wire and solder) to a first terminal of a pull-up resistor 224, which has a second terminal electrically coupled a power supply terminal V+ that is coupled to logical high voltage output from a power source (e.g., battery). In addition, the input post 210 of the split input terminal 118 is electrically coupled to a detection circuit 226, which is electrically coupled to a controller 228. In one or more embodiments, the controller 228 includes a processor and a memory that stores instructions that, when executed by the processor, cause the controller 228 to perform the functions of the controller 228 described herein. In one or more implementations, the detection circuit 226 outputs a signal having the logical high voltage while an electrical test lead is not inserted into the split input terminal 118, and outputs a signal having a logical low voltage while an electrical test lead is inserted into the split input terminal 118.

The other input post 212 of the split input terminal 118 is electrically coupled to a first terminal of a circuit breaker device 230 having a control terminal electrically coupled to the controller 228. The circuit breaker device 230 also has a second terminal that is electrically coupled to a first terminal of a fuse 232. The controller 228 provides to the circuit breaker device 230 a control signal that controls whether the circuit breaker device 230 is in a conductive state in which the first terminal and the second terminal of the circuit breaker device 230 are electrically coupled together, or a nonconductive state in which the first terminal and the second terminal of the circuit breaker device 230 are not electrically coupled together. For example, when the control signal provided by the controller 228 to the circuit breaker device 230 has a logical low value, the circuit breaker device 230 is in the nonconductive state; and, when the control signal provided by the controller 228 to the circuit breaker device 230 has a logical high value, the circuit breaker device 230 is in the conductive state. Examples of the circuit breaker device 230 include a relay, a contactor, and a reed switch. When the circuit breaker device 230 is in the nonconductive state, the input post 212 of the split input terminal 118 is not electrically coupled to the fuse 232, which prevents the fuse 232 from being damaged (e.g., blown) when large voltage at open circuit (VOC) is present between the split input terminal 118 and the common terminal 122. A second terminal of the fuse 232 is electrically coupled to a first terminal of a shunt resistor 234. A second terminal of the shunt resistor 234 is electrically coupled to the common input terminal 122.

In addition, a mode selection circuit 236 and an alarm circuit 238 are electrically coupled to the controller 228. In one or more implementations, the mode selection circuit 236 includes an encoder that is mechanically coupled to the rotatable knob 104, and generates one or more signals indicating a mode of operation corresponding to a current position of the rotatable knob 104, and provides the one or more signals indicating the mode of operation to the controller 228. The mode of operation corresponds to a particular mode of operation selected using the rotatable knob 104. The controller 228 uses the one or more signals indicating the mode of operation provided by the mode selection circuit 236 and the signal provided by the detection circuit 226 to determine whether to cause the circuit breaker device 230 to be in the conductive state or the nonconductive state, and whether or not to cause the alarm circuit 238 or the display device 130 to issue a warning.

In one or more embodiments, when the tip of the rotatable knob 104 is positioned at position 106a corresponding to the V AC mode of operation, the mode selection circuit 236 provides one or more signals indicating a code of "0001" to the measurement circuit 118. When the tip of the rotatable knob 104 is positioned at position 106b corresponding to the V DC mode of operation, the mode selection circuit 236 provides one or more signals indicating a code of "0010" to the measurement circuit 118. When the tip of the rotatable knob 104 is positioned at position 106c corresponding to the mV DC mode of operation, the mode selection circuit 236 provides one or more signals indicating a code of "0011" to the measurement circuit 118. When the tip of the rotatable knob 104 is positioned at position 106d corresponding to the mV DC mode of operation, the mode selection circuit 236 provides one or more signals indicating a code of "0100" to the measurement circuit 118. When the tip of the rotatable knob 104 is positioned at position 106e corresponding to the S2 mode of operation, the mode selection circuit 236 provides one or more signals indicating a code of "0101" to the measurement circuit 118. When the tip of the rotatable knob 104 is positioned at position 106f corresponding to the capacitance mode of operation, the mode selection circuit 236 provides one or more signals indicating a code of "0110" to the measurement circuit 118. When the tip of the rotatable knob 104 is positioned at position 106g corresponding to the A AC or DC mode of operation, the mode selection circuit 236 provides one or more signals indicating a code of "0111" to the measurement circuit 118. When the tip of the rotatable knob 104 is positioned at position 106h corresponding to the mA AC or DC mode of operation, the mode selection circuit 236 provides one or more signals indicating a code of "1000" to the measurement circuit 118. When the tip of the rotatable knob 104 is positioned at position 106i corresponding to the μA mode of operation, the mode selection circuit 236 provides one or more signals indicating a code of "1001" to the measurement circuit 118. When the tip of the rotatable knob 104 is positioned at position 106j corresponding to the ° C. mode of operation, the mode selection circuit 236 provides one or more signals indicating a code of "1010" to the measurement circuit 118.

In one or more implementations, the alarm circuit 238 includes a sound-emitting device (e.g., a buzzer) that emits a sound when the controller 228 causes current to flow through the sound-emitting device. In one or more implantations, the alarm circuit 238 includes a speaker, and the controller 228 causes the speaker to emit sounds of a voice warning that damage to the device 100 may result if the device 100 is operated in the current mode of operation because a test is inserted into a particular terminal (e.g., split input terminal 118 or 120). Additionally or alternatively, the alarm circuit 238 may include a light-emitting device (e.g., LED) that emits light when the controller 228 causes current to flow through the light-emitting device. In one or more implementations, a switch is electrically coupled between the alarm circuit 238 and a terminal coupled to a voltage provided by a battery, and the controller 228 provides a control signal that causes the switch to be in a conductive state or a nonconductive state depending on a voltage level of the control signal. For example, if the control signal provided by the controller 228 has a logical low voltage, the switch is in the nonconductive state, which prevents the voltage provided by the battery from being supplied to the alarm circuit 228, and no alarm or warning is generated by the alarm circuit 238; and, if the control signal provided by the controller 228 has a logical high voltage, the switch is in the conductive state, which causes the voltage provided by the battery to be supplied to the alarm circuit 228, and an alarm or warning is generated by the alarm circuit 238.

in the conductive state or the nonconductive state and whether or not to cause the alarm circuit 238 to issue an alarm or warning (e.g., emit an alarming sound and/or cause a warning light to illuminate) that warns a user that damage to the device 100 may result if the device 100 is operated in its current configuration.

Figure 5:
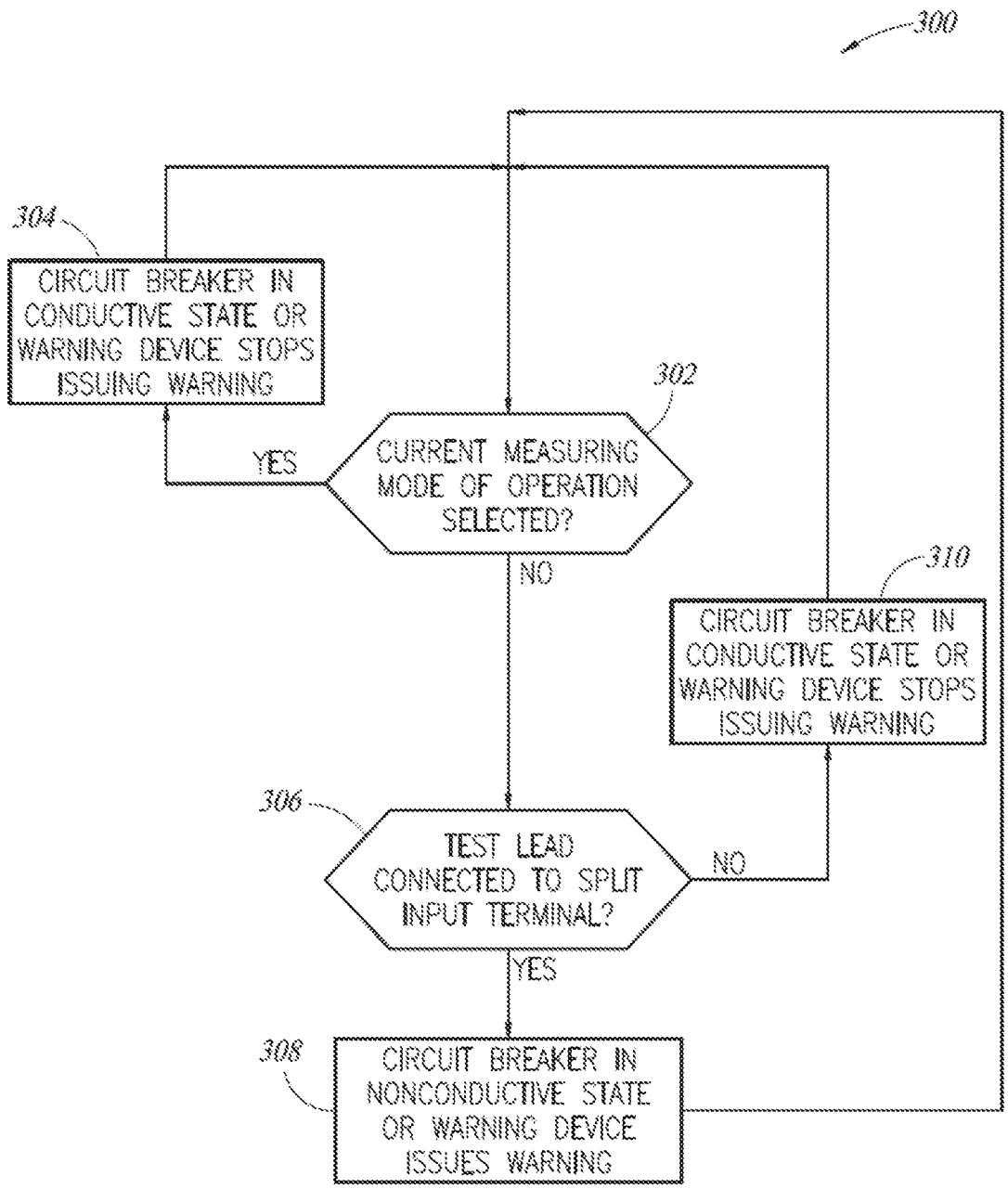
FIG. 5 is a logic flow diagram of a device in accordance with embodiments described herein.

FIG. 5 is a logic flow diagram depicting a logical flow 300 of a device 100 in accordance with embodiments described herein. In one or more implementations, the logical flow 300 corresponds to a logical flow of the controller 228. The logical flow 300 begins at 302. At 302, a determination is made whether a current measuring mode of operation has been selected. For example, a current measuring mode of operation includes three modes of operation corresponding to A, mA, or μA measurement, wherein modes of operation not for current measurement include modes of operation corresponding to V ac, V dc, mV dc, capacitance, Ω, or ° C. The controller 228 determines whether a current measuring mode of operation has been selected based on the one or more signals provided by the mode selection circuit 236. If a determination is made at 302 that a current measuring mode is selected, the logical flow 300 proceeds to 304. If a determination is made at 302 that a current measuring mode of operation is not selected, the logical flow 300 proceeds to 306.

At 304, the circuit breaker device is controlled to be in the conductive state, or the warning device is controlled to stop issuing a warning. For example, the controller 228 provides circuit breaker device 230 a control signal having the logical low voltage, which causes the circuit breaker device 230 to be in the conductive state. Additionally or alternatively, the controller 228 provides to the alarm circuit 238 a control signal having the logical low voltage, which causes the alarm circuit 238 to stop issuing an alarm or warning. Additionally or alternatively, the controller 228 provides to the display device 130 a control signal that causes the display device 130 to stop issuing a warning, e.g., stopping the display of a warning message. The logical flow 300 then returns to 302.

At 306, a determination is made whether an electrical test lead is connected to a split input terminal. For example, the controller 228 determines whether a test lead is connected to the split input terminal 118 by determining whether the signal provided by the detection circuit 226 has a logical high voltage or a logical low voltage. If a determination is made at 306 that the test lead is connected (e.g., signal

TABLE 1

| Mode of operation from mode selection circuit 236 indicates | Voltage level of signal from detection circuit 226 | Voltage level of control signal to circuit breaker device 230 and alarm circuit 238 |
| --- | --- | --- |
| Mode of operation for current measurement (e.g., A, mA, or μA) | Does not matter | Logical low voltage (circuit breaker device 230 in conductive state, no warning issued by alarm circuit 238) |
| Mode of operation not for current measurement (e.g., V ac, V dc, mV dc, capacitance, Ω, or ° C.) | Logical high voltage (no test lead inserted in split input terminal 118 or 120) | Logical low voltage (circuit breaker device 230 in conductive state, no warning issued by alarm circuit 238) |
| Mode of operation not for current measurement (e.g., V ac, V dc, mV dc, capacitance, Ω, or ° C.) | Logical low voltage (test lead inserted in split input terminal 118 or 120) | Logical high voltage (circuit breaker device 230 in nonconductive state, warning issued by alarm circuit 238) |

Table 1 above shows an example of a logic table that may be stored by the controller 228, and used to determine whether or not to cause the circuit breaker device 230 to be provided by the detection circuit 226 has the logical low voltage), the logical flow 300 proceeds to 308. If a determination is made at 306 that a test lead is not connected (e.g., signal provided by the detection circuit 226 has the logical high voltage), the logical flow 300 proceeds to 310.

At 308, the circuit breaker device is controlled to be in the nonconductive state, or the warning device is controlled to issue a warning. For example, the controller 228 provides to circuit breaker device 230 a control signal having the logical high voltage, which causes the circuit breaker device 230 to be in the nonconductive state. Additionally or alternatively, the controller 228 provides to the alarm circuit 238 a control signal having the logical high voltage, which causes the alarm circuit 238 to issue an alarm or warning. Additionally or alternatively, the controller 228 provides to the display device 130 a control signal that causes the display device 130 to issue a warning by displaying a warning message (e.g., "Warning! Damage may result if test lead is not removed from A or mA μA input terminal, or mode of operation is not changed"). The logical flow 300 then returns to 302.

At 310, the circuit breaker device is controlled to be in the conductive state, or the warning device is controlled to stop issuing a warning. For example, the controller 228 provides circuit breaker device 230 a control signal having the logical low voltage, which causes the circuit breaker device 230 to be in the conductive state. Additionally or alternatively, the controller 228 provides to the alarm circuit 238 a control signal having the logical low voltage, which causes the alarm circuit 238 to stop issuing an alarm or warning. Additionally or alternatively, the controller 228 provides to the display device 130 a control signal that causes the display device 130 to stop issuing a warning, e.g., stopping the display of a warning message. The logical flow 300 then returns to 302.

Figure 6A:
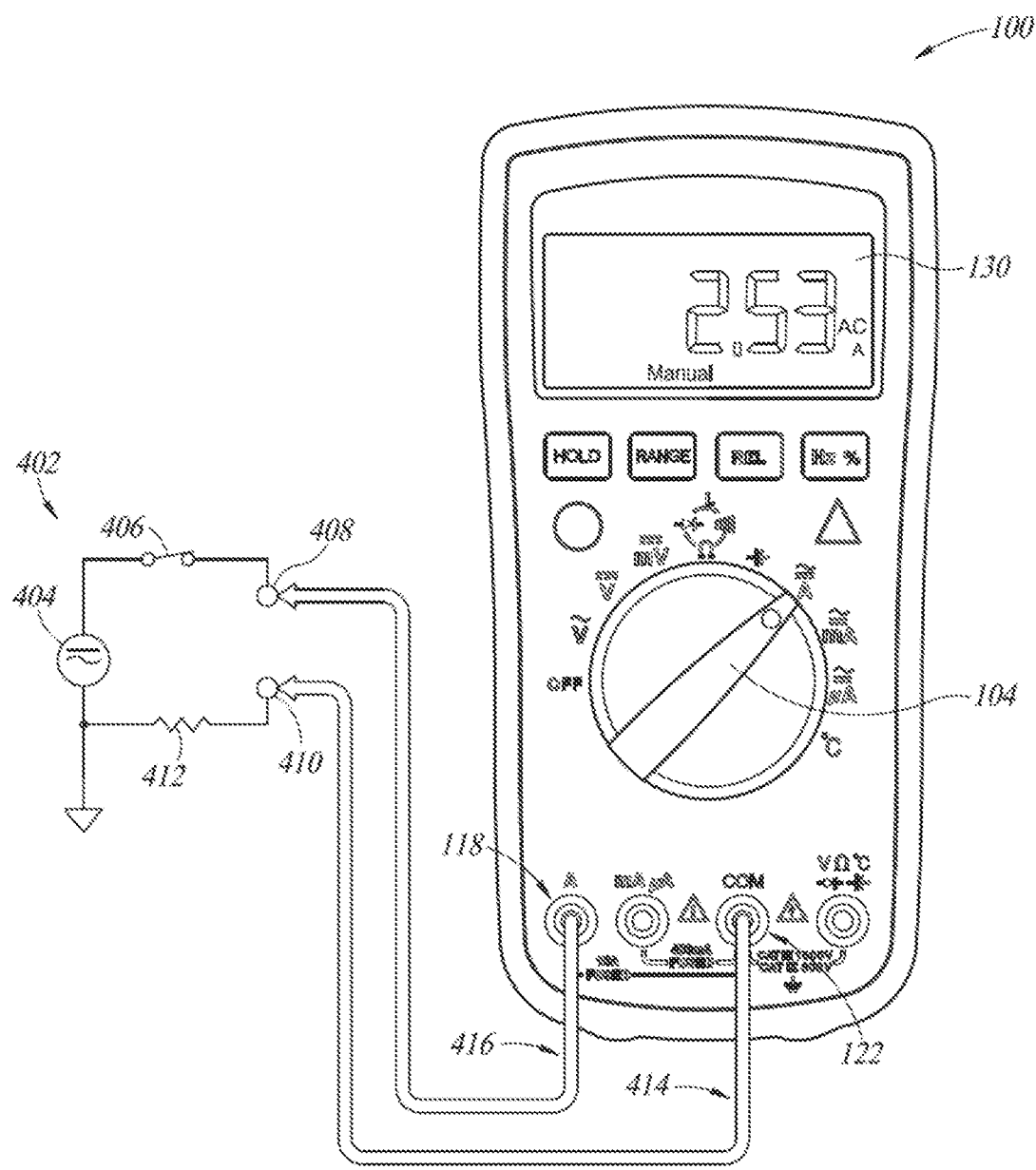
FIGS. 6A and 6B are diagrams for explaining the use of a device in accordance with embodiments described herein.
Figure 6B:
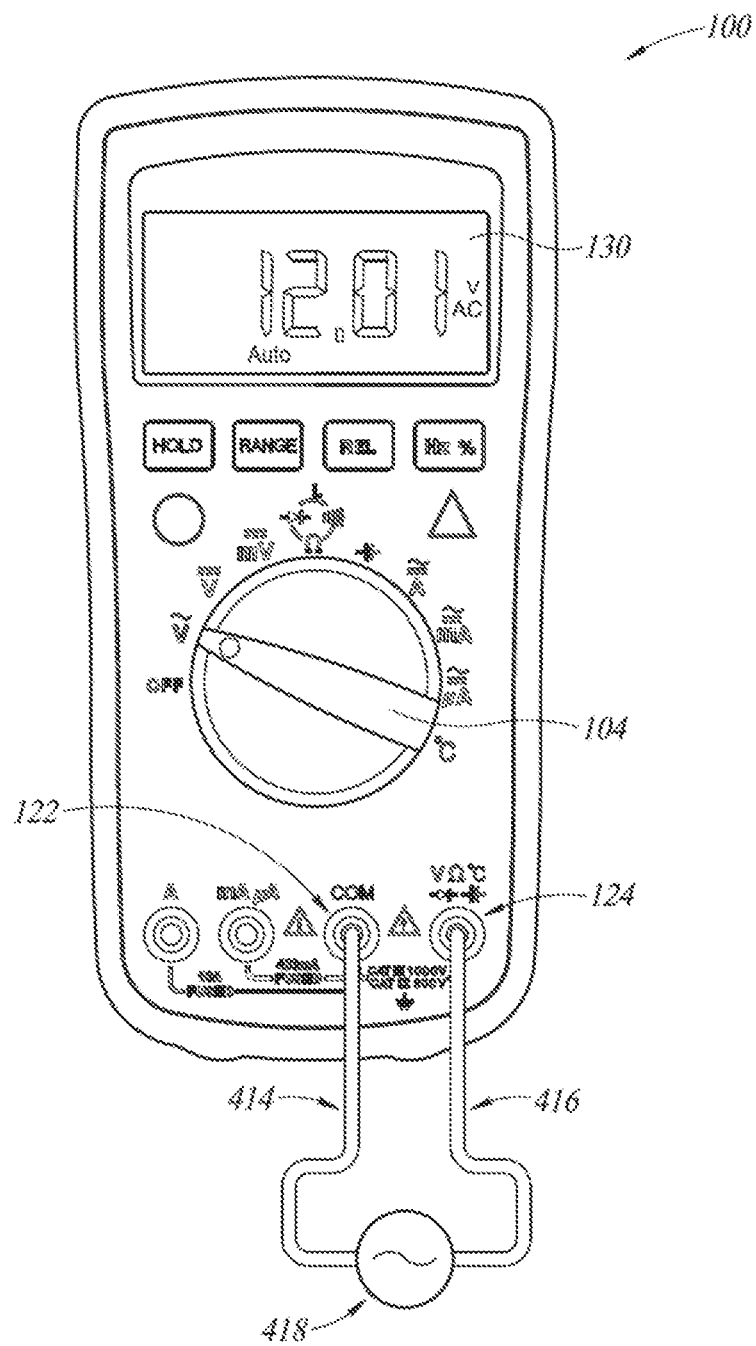

FIGS. 6A and 6B are diagrams for explaining the use of a device 100 in accordance with embodiments described herein. FIG. 6A illustrates an example in which the device 100 is used to measure a current flowing in a circuit 402. The circuit 402 includes a voltage source 404, a switch 406, a node 408, a node 410, and resistor 412 electrically coupled in series. A user connects a first connector of a test lead 414 to the common terminal 122, and connects a second connector of the test lead 414 to the node 410. Also, the user connects a first connector of a test lead 416 to the split input terminal 118, and connects a second connector of the test lead 416 to the node 408. In addition, the user rotates the rotatable knob 104 so that the tip is at the position 106f corresponding to a current measuring mode of operation (e.g., A). The user causes the switch 406 of the circuit 402 to close, and a current flowing from node 408 to node 410 is measured by a measurement circuit, and a result of the current measurement is displayed by the display device 130.

FIG. 6A illustrates a correct operation of the device 100. In other words, the user has rotated the rotatable knob 104 to a position corresponding to a current measuring mode of operation for which it is appropriate to connect a test lead to the split input terminal 118. Accordingly, the device 100 does not cause the circuit breaker device 130 to be in the nonconductive state and does not issue a warning via the display device 130 or the alarm circuit 238. However, if the user subsequently rotates the rotatable knob 104 to a position not corresponding to a current measuring mode of operation (e.g., V AC) while the test lead 416 is connected to the split input terminal 118 (or the split input terminal 120), the device 100 would cause the circuit breaker device 130 to be in the nonconductive state and would issue a warning via the display device 130 or the alarm circuit 238 until the user disconnects the test lead 416 from the split input terminal 118 (or the split input terminal 120) or the rotates the rotatable knob 104 to a position corresponding to a current measuring mode of operation.

FIG. 6B illustrates an example in which the device 100 is used to measure a voltage between two terminals of a voltage source 418. A user connects the first connector of the test lead 414 to the common terminal 122, and connects the second connector of the test lead 414 to one of the terminals of the voltage source 418. Also, the user connects the first connector of the test lead 416 to the input terminal 124, and connects the second connector of the test lead 416 to the other of the terminals of the voltage source 418. In addition, the user rotates the rotatable knob 104 to position 106a that does not correspond to a current measuring mode of operation (e.g., V AC).

FIG. 6B illustrates a correct operation of the device 100. In other words, the user has rotated the rotatable knob 104 to a position not corresponding to a current measuring mode of operation for which it is appropriate to connect a test lead to the input terminal 124. Accordingly, the device 100 does not cause the circuit breaker device 130 to be in the nonconductive state and does not issue a warning via the display device 130 or the alarm circuit 238. However, if the user subsequently disconnects the first connector of the test lead 416 from the input terminal 124 and then connects the first connector of the test lead 416 to the split input terminal 118 or 120 while the rotatable knob 104 is at the position shown in FIG. 6B, this would cause the circuit breaker device 130 to be in the nonconductive state or would cause a warning to be issued via the display device 130 or the alarm circuit 238 until the user disconnects the test lead 416 from the split input terminal 118 (or the split input terminal 120) or rotates the rotatable knob 104 to a position corresponding to a current measuring mode of operation.

The various embodiments described above can be combined to provide further embodiments. Aspects of the embodiments can be modified, if necessary, to employ concepts of the various patents, applications, and publications to provide yet further embodiments. Although the mode selection circuit 236 described above outputs a code indicating a position of the rotatable knob 104 that corresponds to an operating mode of the device 100, the mode selector 104 may be implemented using a different type selection mechanism. For example, the mode selector 104 may include a touch screen that outputs different codes respectively corresponding to different operating modes of the device 100 based on selections made by using the touch screen.

A device for performing electrical measurements according to the present disclosure may be summarized as including a first input post that is electrically conducting, a second input post that is electrically conducting, and a sleeve that is electrically insulating and at least partially surrounds the first input post and the second input post. The sleeve may include a first rib extending in a longitudinal direction of the sleeve and a second rib extending in the longitudinal direction of the sleeve. The first rib and the second rib may be constructed to separate the first input post and the second input post.

The device may be a digital multimeter, and the first input post, the second input post, and the sleeve may be included in an input terminal for current measurement.

The device may further include a case. The case may include a portion that extends across an aperture formed in the case. The first input post and the second input post may extend through the aperture formed in the case with the portion of the case that extends across the aperture formed in the case disposed between the first input post and the second input post.

The first input post may contact a first surface of the first rib and a first surface of the second rib, and the second input post may contact a second surface of the first rib and a second surface of the second rib.

The device may further include a circuit board, a first electrical connector electrically coupled to the first input post and a first electrical conductor on the circuit board, and a second electrical connector electrically coupled to the second input post and a second electrical conductor on the circuit board. The first electrical connector may be coupled to the first input post and the second electrical connector may be coupled to the second input post by screws. The first electrical connector may be coupled to the first electrical conductor and the second electrical connector may be coupled to the second electrical conductor by solder.

The device may further include a case including a recessed portion in which the first input post, the second input post, and the sleeve are at least partially disposed, and a circuit board including an aperture in which the recessed portion of the case may be disposed.

The device may further include a first electrical connector electrically coupled to the first input post, a second electrical connector electrically coupled to the second input post; and a case including a recessed portion in which the first input post, the second input post, and the sleeve are at least partially disposed. The first electrical connector and the second electrical connector may each include a contact portion, a first retaining portion that extends from the contact portion, and a second retaining portion that extends from the contact portion. The contact portion and the first retaining portion of the first electrical connector may be disposed on the first input post, and the second retaining portion of the first electrical connector may be disposed on a side wall of the recessed portion of the case. The contact portion and the first retaining portion of the second electrical connector may be disposed on the second input post, and the second retaining portion of the second electrical connector may be disposed on the side wall of the recessed portion of the case.

The device may further include a mode selection circuit that outputs at least one signal indicating at least one mode in which the device operates, a detection circuit that outputs at least one signal indicating whether the first input post is electrically coupled to the second input post, and a controller that outputs at least one control signal based on the at least one signal output by the mode selection circuit and the at least one signal output by the detection circuit. The device may further include a circuit breaker device that receives the at least one control signal output by the controller. The at least one control signal may cause the circuit breaker device to be in a nonconductive state while the at least one signal output by the mode selection circuit indicates a first mode in which the device operates and the at least one signal output by the detection circuit indicates that the first input post is electrically coupled to the second input post. The at least one control signal may cause the circuit breaker device to be in a conductive state while the at least one signal output by the mode selection circuit indicates a second mode in which the device operates and the at least one signal output by the detection circuit indicates that the first input post is electrically coupled to the second input post. The device may further include a warning device that receives the at least one control signal output by the controller. The at least one control signal may cause the warning device to issue a warning while the at least one signal output by the mode selection circuit indicates a first mode in which the device operates and the at least one signal output by the detection circuit indicates that the first input post is electrically coupled to the second input post. The at least one control signal may cause the warning device to stop issuing the warning while the at least one signal output by the mode selection circuit indicates a second mode in which the device operates and the at least one signal output by the detection circuit indicates that the first input post is electrically coupled to the second input post.

A system for performing electrical measurements according to the present disclosure may be summarized as including a split input terminal including a first input post, a second input post, and a sleeve that is electrically insulating and at least partially surrounds the first input post and the second input post, the sleeve including a pair of ribs that extend in a longitudinal direction of the sleeve to separate the first input post and the second input post, and a controller coupled to the split input terminal, configured to control a circuit breaker device or a warning device based on a device operating mode in connection with a status of electrical connectivity between the first input post and the second input post.

The controller may control the circuit breaker device to be in a nonconductive state or control the warning device to issue a warning while the device operating mode is a first mode and the status of electrical connectivity is that the first input post is electrically coupled to the second input post. The controller may control the circuit breaker device to be in a conductive state or controls the warning device to stop issuing the warning while the device operating mode is a second mode and the status of electrical connectivity is that the first input post is electrically coupled to the second input post. The controller may control the circuit breaker device to be in the conductive state or control the warning device to stop issuing the warning while the status of electrical connectivity is that the first input post is not electrically coupled to the second input post.

The system may further include a mode selection circuit that outputs at least one signal indicating the device operating mode to the controller, and a detection circuit that outputs at least one signal indicating the status of electrical connectivity between the first input post and the second input post to the controller.

The warning device may be at least one of a light emitting device that emits light, a sound emitting device that emits sound, or a display device that displays a message.

A method of operating a digital multimeter device to reduce risk of damaging the digital multimeter device according to the present disclosure may be summarized as including receiving at least one signal indicating a mode in which the digital multimeter device is operating, receiving at least one signal indicating whether a first input post of a split input terminal is electrically coupled to a second input post of the split input terminal, and causing a circuit breaker device to be in a nonconductive state or causing a warning device to issue a warning based on the at least one signal indicating the mode in which the digital multimeter device is operating and the at least one signal indicating whether the first input post is electrically coupled to the second input post.

The causing the circuit breaker device to be in the nonconductive state or causing the warning device to issue the warning may include causing the circuit breaker device to be in the nonconductive state or causing the warning device to issue the warning while the at least one signal indicating the mode in which the digital multimeter device is operating indicates a first mode and the at least one signal indicating whether the first input post is electrically coupled to the second input post indicates that the first input post is electrically coupled to the second input post, and the method may further include causing the circuit breaker device to be in a conductive state or causing the warning device to stop issuing the warning while the at least one signal indicating the mode in which the digital multimeter device is operating indicates a second mode different from the first mode and the at least one signal indicating whether the first input post is electrically coupled to the second input post indicates that the first input post is electrically coupled to the second input post.

The method may further include causing the circuit breaker device to be in the conductive state or causing the warning device to stop issuing the warning while the at least one signal indicating whether the first input post is electrically coupled to the second input post indicates that the first input post is not electrically coupled to the second input post.

The causing the circuit breaker device to be in the nonconductive state or causing the warning device to issue the warning may include causing the circuit breaker device to be in the nonconductive state and causing the warning device to issue the warning.

The causing the warning device to issue the warning may include at least one of causing a light emitting device to emit light, causing a sound emitting device to emit sound, or causing a display device to display a message.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device for performing electrical measurements, the device comprising:
   a first input post that is electrically conducting;
   a second input post that is electrically conducting; and
   a sleeve that is electrically insulating and at least partially surrounds the first input post and the second input post,
   wherein the sleeve includes a first rib extending in a longitudinal direction of the sleeve and a second rib extending in the longitudinal direction of the sleeve,
   wherein the first rib and the second rib are constructed to insulate the first input post from the second input post when an electrical test lead is not inserted into the sleeve, and
   wherein, when an electrical test lead is inserted into the sleeve, the first input post and the second input post are configured to be electrically coupled together.

2. The device of claim 1, wherein:
   the device is a digital multimeter, and
   the first input post, the second input post, and the sleeve are included in an input terminal for current measurement.

3. The device of claim 1, further comprising:
   a case,
   wherein the case includes a portion that extends across an aperture formed in the case, and
   wherein the first input post and the second input post extend through the aperture formed in the case with the portion of the case that extends across the aperture formed in the case disposed between the first input post and the second input post.

4. The device of claim 1, wherein:
   the first input post contacts a first surface of the first rib and a first surface of the second rib, and
   the second input post contacts a second surface of the first rib and a second surface of the second rib.

5. The device of claim 1, further comprising:
   a circuit board;
   a first electrical connector electrically coupled to the first input post and a first electrical conductor on the circuit board; and
   a second electrical connector electrically coupled to the second input post and a second electrical conductor on the circuit board,
   wherein the first electrical connector is coupled to the first input post and the second electrical connector is coupled to the second input post by screws, and
   wherein the first electrical connector is coupled to the first electrical conductor and the second electrical connector is coupled to the second electrical conductor by solder.

6. The device of claim 1, further comprising:
   a case including a recessed portion in which the first input post, the second input post, and the sleeve are at least partially disposed; and
   a circuit board including an aperture in which the recessed portion of the case is disposed.

7. The device of claim 1, further comprising:
   a first electrical connector electrically coupled to the first input post;
   a second electrical connector electrically coupled to the second input post; and
   a case including a recessed portion in which the first input post, the second input post, and the sleeve are at least partially disposed,
   wherein the first electrical connector and the second electrical connector each include a contact portion, a first retaining portion that extends from the contact portion, and a second retaining portion that extends from the contact portion,
   wherein the contact portion and the first retaining portion of the first electrical connector are disposed on the first input post, and the second retaining portion of the first electrical connector is disposed on a side wall of the recessed portion of the case, and
   wherein the contact portion and the first retaining portion of the second electrical connector are disposed on the second input post, and the second retaining portion of the second electrical connector is disposed on the side wall of the recessed portion of the case.

8. The device of claim 1, further comprising:
   a mode selection circuit that outputs at least one signal indicating at least one mode in which the device operates;
   a detection circuit that outputs at least one signal indicating whether the first input post is electrically coupled to the second input post; and
   a controller that outputs at least one control signal based on the at least one signal output by the mode selection circuit and the at least one signal output by the detection circuit.

9. The device of claim 8, further comprising:
   a circuit breaker device that receives the at least one control signal output by the controller,
   wherein the at least one control signal causes the circuit breaker device to be in a nonconductive state while the at least one signal output by the mode selection circuit indicates a first mode in which the device operates and the at least one signal output by the detection circuit indicates that the first input post is electrically coupled to the second input post, or wherein the at least one control signal causes the circuit breaker device to be in a conductive state while the at least one signal output by the mode selection circuit indicates a second mode in which the device operates and the at least one signal output by the detection circuit indicates that the first input post is electrically coupled to the second input post.

10. The device of claim 8, further comprising:

a warning device that receives the at least one control signal output by the controller, wherein the at least one control signal causes the warning device to issue a warning while the at least one signal output by the mode selection circuit indicates a first mode in which the device operates and the at least one signal output by the detection circuit indicates that the first input post is electrically coupled to the second input post, or wherein the at least one control signal causes the warning device to stop issuing the warning while the at least one signal output by the mode selection circuit indicates a second mode in which the device operates and the at least one signal output by the detection circuit indicates that the first input post is electrically coupled to the second input post.

11. A system for performing electrical measurements, the system comprising:

a split input terminal including a first input post, a second input post, and a sleeve that is electrically insulating and at least partially surrounds the first input post and the second input post, the sleeve including a pair of ribs that extend in a longitudinal direction of the sleeve to insulate the first input post from the second input post when an electrical test lead is not inserted into the sleeve, wherein, when an electrical test lead is inserted into the sleeve, the first input post and the second input post are configured to be electrically coupled together; and a controller coupled to the split input terminal, configured to control a circuit breaker device or a warning device based on a device operating mode in connection with a status of electrical connectivity between the first input post and the second input post.

12. The system of claim 11, wherein:

the controller controls the circuit breaker device to be in a nonconductive state or controls the warning device to issue a warning while the device operating mode is a first mode and the status of electrical connectivity is that the first input post is electrically coupled to the second input post, or the controller controls the circuit breaker device to be in a conductive state or controls the warning device to stop issuing the warning while the device operating mode is a second mode and the status of electrical connectivity is that the first input post is electrically coupled to the second input post.

13. The system of claim 12, wherein:

the controller controls the circuit breaker device to be in the conductive state or controls the warning device to stop issuing the warning while the status of electrical connectivity is that the first input post is not electrically coupled to the second input post.

14. The system of claim 11, further comprising:

a mode selection circuit that outputs at least one signal indicating the device operating mode to the controller; and a detection circuit that outputs at least one signal indicating the status of electrical connectivity between the first input post and the second input post to the controller.

15. The system of claim 11, wherein:

the warning device is at least one of a light-emitting device that emits light, a sound-emitting device that emits sound, or a display device that displays a message.

16. A method of operating a digital multimeter device to reduce risk of damaging the digital multimeter device, the method comprising:

receiving at least one signal indicating a mode in which the digital multimeter device is operating;

receiving at least one signal indicating whether a first input post of a split input terminal is electrically coupled to a second input post of the split input terminal, wherein the split input terminal includes a sleeve that is electrically insulating and at least partially surrounds the first input post and the second input post, wherein the sleeve includes a first rib extending in a longitudinal direction of the sleeve and a second rib extending in the longitudinal direction of the sleeve, wherein the first rib and the second rib are constructed to insulate the first input post from the second input post when an electrical test lead is not inserted into the sleeve, and wherein, when an electrical test lead is inserted into the sleeve, the first input post and the second input post are configured to be electrically coupled together; and causing a circuit breaker device to be in a nonconductive state or causing a warning device to issue a warning based on the at least one signal indicating the mode in which the digital multimeter device is operating and the at least one signal indicating whether the first input post is electrically coupled to the second input post.

17. The method of claim 16, wherein:

the causing the circuit breaker device to be in the nonconductive state or causing the warning device to issue the warning includes causing the circuit breaker device to be in the nonconductive state or causing the warning device to issue the warning while the at least one signal indicating the mode in which the digital multimeter device is operating indicates a first mode and the at least one signal indicating whether the first input post is electrically coupled to the second input post indicates that the first input post is electrically coupled to the second input post, and the method further comprises causing the circuit breaker device to be in a conductive state or causing the warning device to stop issuing the warning while the at least one signal indicating the mode in which the digital multimeter device is operating indicates a second mode different from the first mode and the at least one signal indicating whether the first input post is electrically coupled to the second input post indicates that the first input post is electrically coupled to the second input post.

18. The method of claim 17, further comprising:

causing the circuit breaker device to be in the conductive state or causing the warning device to stop issuing the warning while the at least one signal indicating whether the first input post is electrically coupled to the second input post indicates that the first input post is not electrically coupled to the second input post.

19. The method of claim 16, wherein:
the causing the circuit breaker device to be in the nonconductive state or causing the warning device to issue the warning includes causing the circuit breaker device to be in the nonconductive state and causing the warning device to issue the warning.

20. The method of claim 16, wherein:
the causing the warning device to issue the warning includes at least one of causing a light-emitting device to emit light, causing a sound-emitting device to emit sound, or causing a display device to display a message.

* * * * *